United States Patent [19]

Yamagata

[11] Patent Number: 5,228,000
[45] Date of Patent: Jul. 13, 1993

[54] TEST CIRCUIT OF SEMICONDUCTOR MEMORY DEVICE

[75] Inventor: Tadato Yamagata, Hyogo, Japan

[73] Assignee: Mitsubishi Denki Kabushiki Kaisha, Tokyo, Japan

[21] Appl. No.: 733,028

[22] Filed: Jul. 22, 1991

[30] Foreign Application Priority Data

Aug. 2, 1990 [JP] Japan .................................. 2-206440
Mar. 26, 1991 [JP] Japan .................................. 3-62050

[51] Int. Cl.$^5$ .............................................. G11C 29/00
[52] U.S. Cl. ...................... 365/201; 371/21.1; 371/21.2
[58] Field of Search ............... 371/21.1, 21.2, 21.3; 365/201, 200, 189.01, 189.12

[56] References Cited

U.S. PATENT DOCUMENTS

| | | | |
|---|---|---|---|
| 4,672,582 | 6/1987 | Nishimura et al. | 365/201 |
| 4,692,901 | 9/1987 | Kumanoya et al. | 365/201 |
| 4,860,259 | 8/1989 | Tobita | 365/201 |
| 4,873,669 | 10/1989 | Furutani et al. | 365/201 |
| 4,899,313 | 2/1990 | Kumanoya et al. | 365/201 |
| 4,962,500 | 10/1990 | Nakagawa | 371/21.2 |
| 5,016,220 | 5/1991 | Yamagata | 365/201 |
| 5,060,198 | 10/1991 | Kowalski | 371/22.1 |

FOREIGN PATENT DOCUMENTS 63-241791 10/1988 Japan .

OTHER PUBLICATIONS

IEEE International Solid-State Circuits Conference, "FAM 17.2: A 90ns 1Mb DRAM with Multi-Bit Test Mode", Kumanoya, et al., Feb. 15, 1985, pp. 240-241 and pp. 352-353.
IEEE International Solid-State Circuits conference, "WAM 1.1: A 90ns 4Mb DRAM in a 300 mil DIP", Feb. 25, 1987, Mashiko et al., pp. 12-13, 314-315.

Primary Examiner—Robert J. Pascal
Assistant Examiner—Tan Dinh
Attorney, Agent, or Firm—Lowe, Price, LeBlanc & Becker

[57] ABSTRACT

In a test mode, bit information of the same logic is written into a corresponding memory cell of each of subarray $5a$-$5d$. Bit information written in respective memory cells is simultaneously read and supplied to exclusive-OR gates $12a$-$12d$. Each of exclusive-OR gates logics of read bit information and an expected value data supplied as an input to an external input pin $D_{IN}$ to supply the test determination result as an output. The outputs of respective exclusive-OR gates $12a$-$12d$ are serially supplied, through transistors $18a$-$18d$ which are sequentially and selectively turned on by a shift register 15, to an external output pin $D_{OUT}$.

6 Claims, 12 Drawing Sheets

TEST CIRCUIT OF SEMICONDUCTOR MEMORY DEVICE

BACKGROUND OF THE INVENTION

Field of the Invention

The present invention relates to test circuits of semiconductor memory devices and, more particularly, to a circuit incorporated in a semiconductor memory device for testing whether the semiconductor memory device is normal or not.

Description of the Background Art

The degree of integration of a dynamic random access memory (hereinafter referred to as DRAM) has been increased at a speed of approximately four times in three years. Now 4-M bit DRAMs are in mass production, and 16-M bit and further, 64-M bit DRAMs are being developed. On the other hand, in accordance with the increase in the storage capacity of a DRAM, the time for testing whether the DRAM is normal or not has largely increased, and the increase in the product cost resulting from it has become considerable. Therefore, a semiconductor memory device has come to incorporate a test circuit for simultaneously writing bit information in a plurality of memory cells of a DRAM, simultaneously reading the plurality of bits of written bit information, simultaneously performing a logical operation on read bit information, supplying the result of the logical operation as an output, and testing whether writing and reading have been correctly carried out in response to the output value. By using the test circuit, it is possible to simultaneously test a plurality of memory cells, so that the test time can be largely reduced.

An example of a DRAM incorporating a test circuit as described above is shown in FIG. 12. The DRAM shown in FIG. 12 is the one shown in U.S. Pat. No. 4,860,259 in which when it is operated in a normal mode, test enable signals TE,/TE are made to attain a low level or "L" and a high level or "H", respectively, and when it is operated in a test mode, the test enable signals TE,/TE are made to attain "H" and "L", respectively.

A variety of methods for making the test enable signals TE,/TE to attain "H" and "L", respectively, to change over the DRAM into the test mode have been proposed and, for example, there is one in which when a row address strobe signal /RAS, a column address strobe signal /CAS, and a write enable signal /WE change in a timing referred to as WCBR (/WE, /CAS before /RAS) as shown in FIG. 13, the DRAM is changed over from the normal mode into the test mode. Specifically, if the column address strobe signal /CAS and the write enable signal /WE are made to attain "L" before the level of the row address strobe signal /RAS lowers, the DRAM is changed over into the test mode. Furthermore, in the normal mode, it does not happen that both the column address strobe signal /CAS and the write enable signal /WE are made to attain "L" before the level of the row address strobe signal /RAS lowers. Then, the test enable signal TE supplied as an output from a clock generator 14 attains "H", and the test enable signal TE attains "L".

On the other hand, when the row address strobe signal RAS and the column address strobe signal /CAS change in the timing referred to as CBR (/CAS before /RAS) as shown in FIG. 14, the mode returns from the test mode to the normal mode. Specifically, if the column address strobe signal /CAS is made to attain "L" before the level of the row address strobe signal /RAS lowers with the write enable signal /WE attaining "H", the test enable signal TE supplied as an output from clock generator 14 attains "L", and the test enable signal /TE attains "H".

Now, operation of the semiconductor memory device shown in FIG. 12 will be described.

(1) Operation in the normal mode

In the semiconductor memory device shown in FIG. 12, in the normal mode, reading and writing are performed as described in the following.

First, during the read operation, an address signal Add (including a row address signal and a column address signal) is supplied to a decoder 1. Decoder 1 decodes, for example, the most significant bit of the row address signal and the most significant bit of the column address signal of the supplied address signal Add, and supplies, for example, four on-off control signals as outputs. These on-off control signals are supplied to respective gates of transistors $4a$–$4d$, and turn on any one of these transistors $4a$–$4d$. On the other hand, decoder 1 decodes the rest of the row address signal and column address signal and supplies the decoded output to a memory cell array 5. Memory cell array 5 includes a plurality of memory cells arranged in a matrix. Further, memory cell array 5 is partitioned in a plurality of subarrays, four subarrays $5a$–$5d$ in FIG. 12. Bit information is read from corresponding memory cells in respective subarrays $5a$–$5d$ in response to the decoded output of decoder 1 and supplied to read amplifiers $6a$–$6d$, respectively. As described above, only one of transistors $4a$–$4d$ is in ON state. Therefore, only one-bit information out of 4-bit information read from each of subarrays $5a$–$5d$ is transferred through one of read amplifiers $6a$–$6d$ to node N6. In the normal mode, as described above, the test enable signal /TE is at "H", and the test enable signal TE is at "L", so that a transistor 8 is in ON state, and a transistor 9 is in OFF state. Therefore, bit information transferred to node N6 is supplied as an output therefrom through an output buffer 7 to an external output pin $D_{OUT}$.

During the write operation, only one of transistors $2a$–$2d$ is turned on in response to the four on/off control signals supplied as outputs from decoder 1 (supplied as outputs by decoding the most significant bit of the row address signal and the most significant bit of the column address signal). At this time, the test enable signal TE is at "L", so that all of transistors $3a$–$3d$ are in OFF state. Therefore, bit information supplied as an input from the external input pin $D_{IN}$ is supplied, through an input buffer 10 activated by a signal W which attains "H" during the write operation, to one of subarrays $5a$–$5d$. On the other hand, in each of subarrays $5a$–$5d$, a corresponding memory cell is selected in response to the decoded output supplied from decoder 1. Therefore, bit information described above is written in the selected memory cell of the subarray supplied with bit information.

(2) Operation in the test mode

The semiconductor memory device shown in FIG. 12 operates as described in the following in the test mode.

First, during the write operation in the test mode, the test enable signal TE attains "H", so that all of transistors 3a–3d attain ON state. Therefore, bit information supplied from the external input pin $D_{IN}$ is supplied through input buffer 10 to all of subarrays 5a–5d. In respective subarrays 5a–5d, supplied bit information described above is simultaneously written into the memory cells which have been selected in response to the decoded output of decoder 1, i.e. the corresponding four memory cells.

During the read operation, stored bit information is simultaneously read from the corresponding four memory cells of respective subarrays 5a–5d selected in response to the decoded output of decoder 1. Bit information read from the selected memory cell of each of subarrays 5a–5d is supplied through read amplifiers 6a–6d to one input terminal of each of exclusive-OR gates 12a–12d. Read 4-bit information at this time is information which has been simultaneously written into the corresponding memory cells of respective subarrays 5a–5d. On the other hand, an expected value data having the same logic as the data which was written when these 4-bit information was written is supplied as an input to the external input pin $D_{IN}$. The expected value data is supplied, through an input buffer 11 activated in response to a signal R which attains "H" during the read operation, to the other input terminal of each of exclusive-OR gates 12a–12d. Therefore, if written information has been correctly read, all of the outputs of exclusive-OR gates 12a–12d attain "L". The outputs of exclusive-OR gates 12a–12d are further supplied as inputs to an OR gate 13. Therefore, if written information has been correctly read, the output of OR gate 13 also attains "L". Now, since the test enable signal/TE is at "L", and the test enable signal TE is at "H", transistor 8 is in OFF state, and transistor 9 is in ON state. This causes the output of OR gate 13 to be supplied as an output to the external output pin $D_{OUT}$. More specifically, if the semiconductor memory device is normally operating, a signal at "L" is supplied as an output to the external output pin $D_{OUT}$. If data is inverted in any one of the corresponding memory cells of respective subarrays 5a–5d, the output of at least one of exclusive-OR gates 12a–12d attains "H", and the output of OR gate 13 also attains "H". Therefore, if the semiconductor memory device is malfunctioning, a signal at "H" is supplied as an output to the external output pin $D_{OUT}$.

As described above, in the test mode, it is possible to simultaneously test the memory operation of a plurality of bits by determining the level of the output signal of the external output pin $D_{OUT}$.

In a test circuit as shown in FIG. 12, however, it is only found that there is abnormality in any of the corresponding memory cells of respective subarrays 5a–5d, and there has been a problem that it is not possible to determine which subarray has the memory cell with abnormality.

Accordingly, a test circuit capable of solving the problem as described above is shown in Japanese Patent Laying-Open No. 63-241791 (1988). In the test circuit shown in the laid open application, the outputs corresponding to the exclusive-OR gates 12a–12d shown in FIG. 12 are supplied as inputs in parallel to a shift register circuit and once stored and held in each latch circuit constituting the shift register circuit. Thereafter, each latch circuit is connected in series and sequentially shifts information stored and held, respectively. The serial output of the shift register circuit described above is supplied to an external output pin. Subsequently, the outputs corresponding to the exclusive-OR gates 12a–12d in FIG. 12 are serially supplied from the external output pin.

In the test circuit shown in Japanese Patent Laying-Open No. 63-241791 (1988), the test determination result of each subarray is serially supplied as an output from the external output pin, so that it is possible to know which subarray has the memory cell with abnormality. In the test circuit shown in Japanese Patent Laying-Open No. 63-241791 (1988), however, since the test determination result of each subarray must be once latched in each latch circuit of the shift register circuit, there has been another problem that outputting the test result is delayed for that. Besides, in the test circuit shown in Patent Japanese Laying-Open No. 63-241791 (1988), each latch circuit must have its connection changed into series after each latch circuit constituting the shift register circuit has fetched the test determination result of each subarray. Accordingly, it is necessary to provide a switching circuit for changing over the connection state to the input terminal of each latch circuit. Consequently, there has been a problem that the structure becomes complicated while the operation becomes complicated because of controlling each switching circuit as well.

SUMMARY OF THE INVENTION

An object of the present invention is to provide a test circuit for a semiconductor memory device in which more detailed test result data can be obtained from a single output pin, outputting the test result can be performed at high speed, and the structure is simple and does not require complicated control operation.

A test circuit of a semiconductor memory device according to the present invention is a circuit for testing a semiconductor memory device comprising a memory cell array partitioned into a plurality of subarrays and includes writing means, reading means, logical operation means, a single output pin, a plurality of switching means, and switch control means. The writing means writes bit information of the same logic in the corresponding memory cell of each subarray, respectively. The reading means reads stored information from the memory cell of each subarray into which writing has been performed by the writing means. The logical operation means performs a specified logical operation on stored information in the memory cell of each subarray read by the reading means to carry out a test and supplies the test result as parallel data of a plurality of bits. The single output pin supplies the test result output of the logical operation means to the outside. Each switching means is interposed between each bit of output data of the logical operation means and the single output pin. The switch control means sequentially and selectively turns on each switching means and serially applies the parallel data output of the logical operation means to the single output pin.

In the present invention, with each switching means being sequentially and selectively turned on by the switch control means, the plurality of bits of parallel data output of the logical operation means is serially applied to the single output pin.

As a result, a test result which is more detailed than the test result obtained in the conventional semiconductor memory device shown in FIG. 12 can be obtained from the single output pin. In addition, since it is not necessary to make the output of the logical operation means once latched in each latch circuit of the shift register circuit as in the test circuit shown in Japanese Patent Laying-Open No. 63-241791 (1988), it is possible to output the test result at high speed. Moreover, the switching circuit for changing over the connection state of each latch circuit constituting the shift register circuit becomes unnecessary, the structure is simple and the control operation is simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
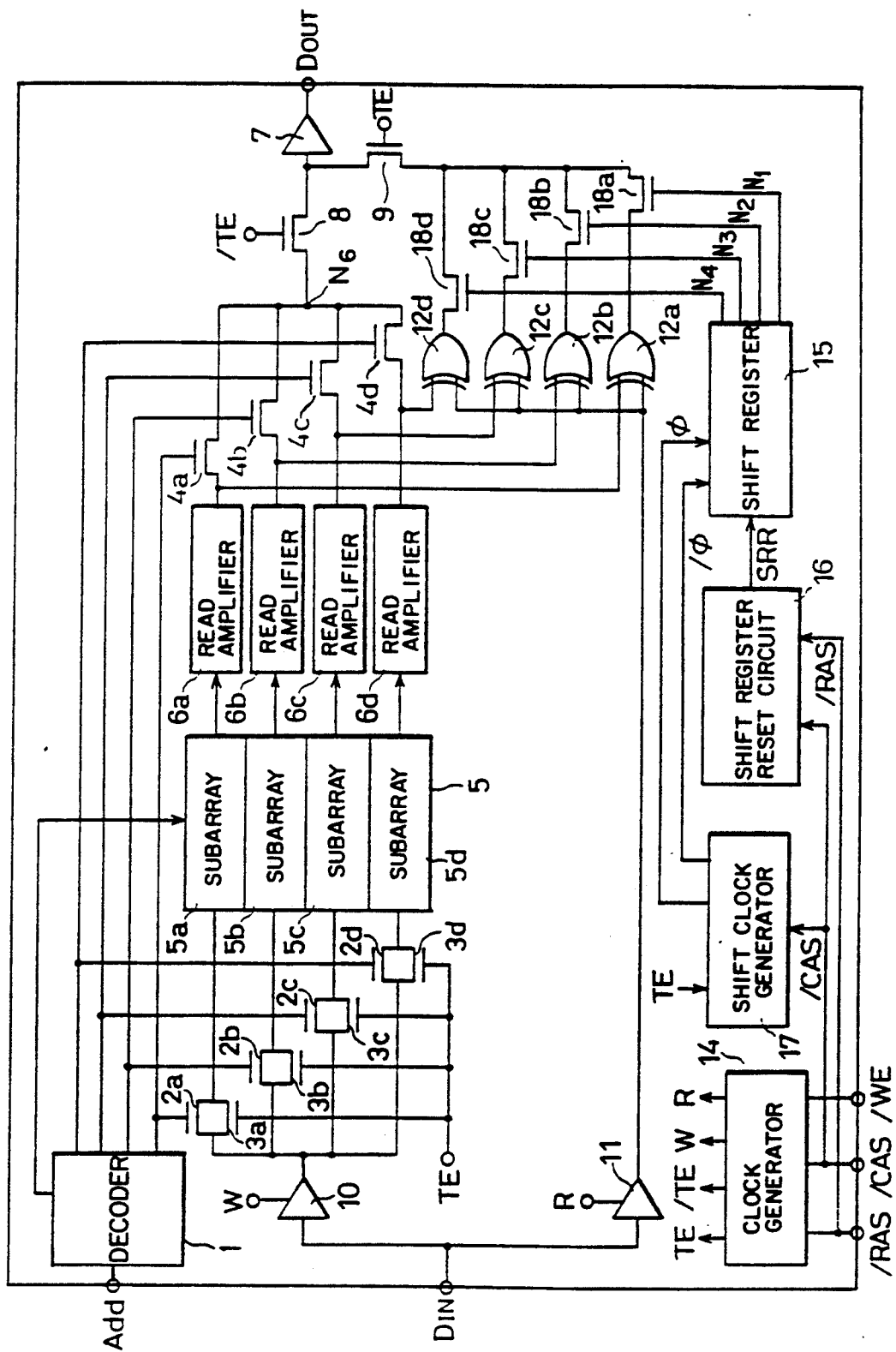
FIG. 1 is a block diagram illustrating the structure of a first embodiment of the present invention.

FIG. 1 is a block diagram showing the structure of a first embodiment of the present invention. The structure of the embodiment shown in FIG. 1 is the same as the structure of the conventional semiconductor memory device shown in FIG. 12 except for the following respects, and the corresponding parts are given the same reference numerals and description of them is not repeated.

Figure 12:
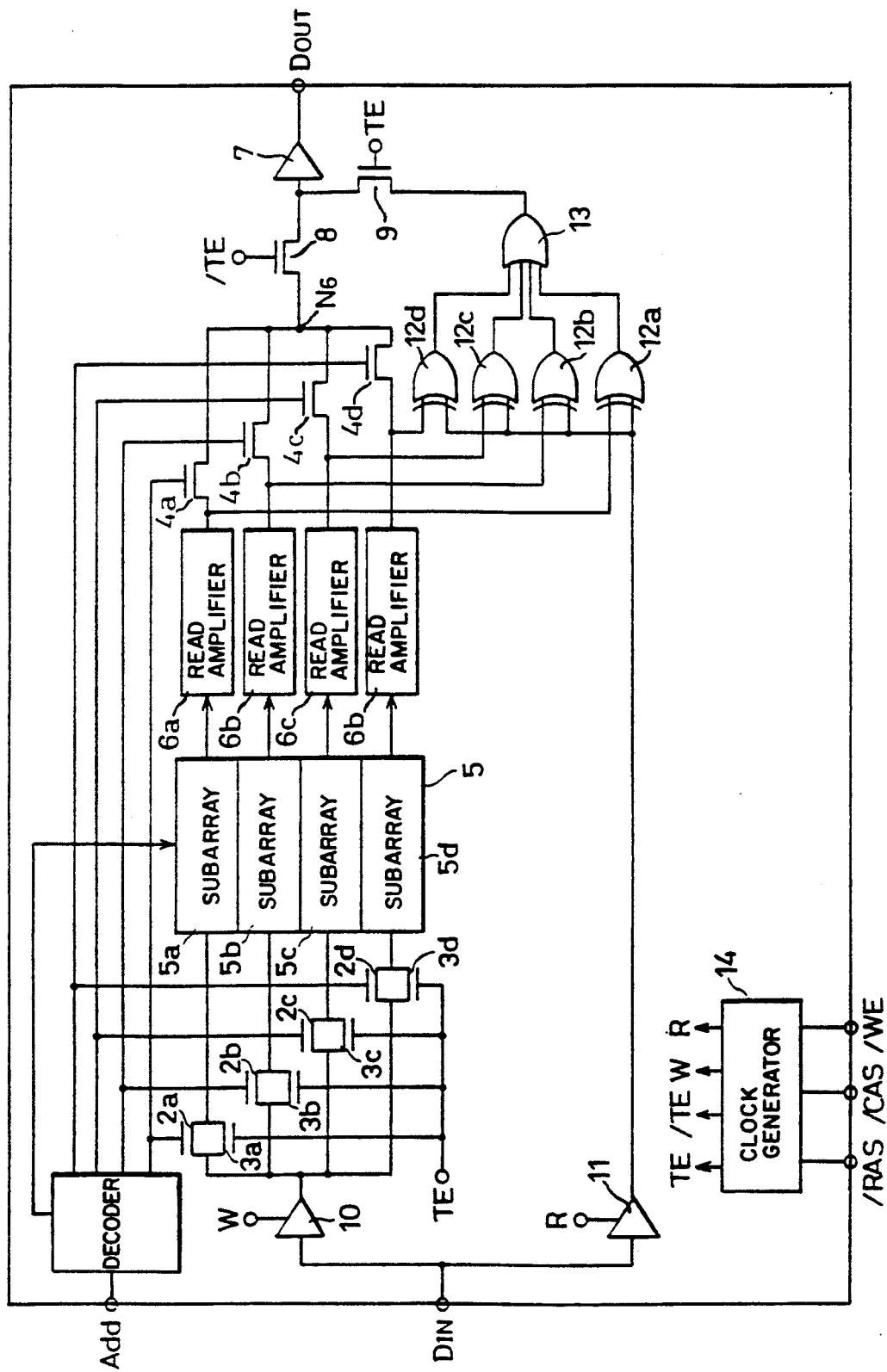
FIG. 12 is a block diagram illustrating an example of the structure of a conventional semiconductor memory device incorporating a test circuit.
Figure 13:
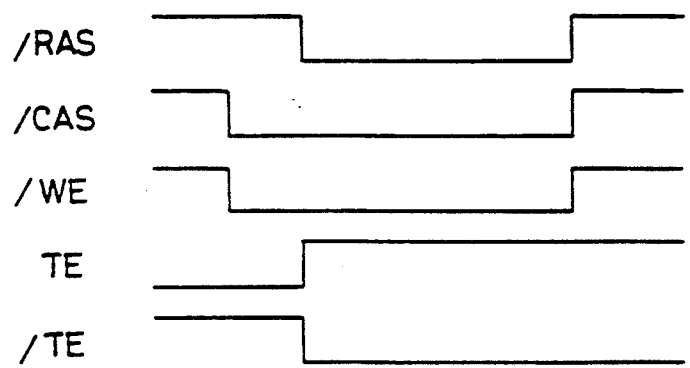
FIG. 13 is a timing chart illustrating the changeover operation from the normal mode into the test mode in the conventional semiconductor memory device shown in FIG. 12.
Figure 14:
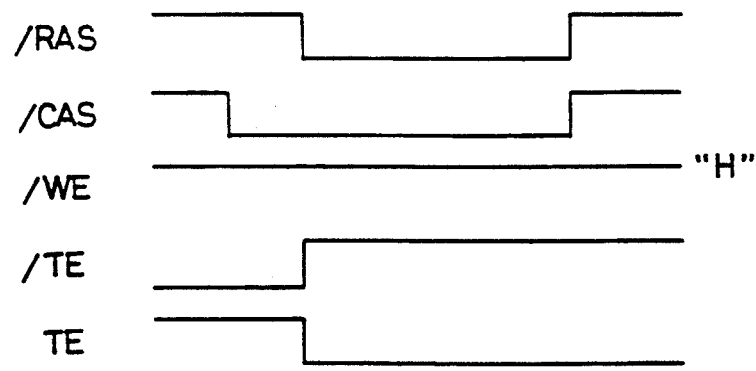
FIG. 14 is a timing chart illustrating the changeover operation from the test mode into the normal mode in the conventional semiconductor memory device shown in FIG. 12.

The embodiment shown in FIG. 1 is different from the conventional semiconductor memory device shown in FIG. 12 in that during the read operation in the test mode, the on-off operation of transistors 18a–18d is controlled in response to the output from a shift register 15, and the outputs from exclusive-OR gates 12a–12d are serially supplied to the external output pin $D_{OUT}$. Shift register 15 has its operation controlled by a shift register reset circuit 16 and a shift clock generator 17. Shift register reset circuit 16 generates a reset signal SRR based upon a column address strobe signal /CAS and a row address strobe signal /RAS externally supplied as inputs thereto and supplies it to each latch circuit in shift register 15. Shift clock generator 17 generates shift clock signals $\phi$, /$\phi$ based upon a column address strobe signal /CAS externally supplied and a test enable signal TE supplied from clock generator 14 and supply them to shift register 15. Shift register 15 performs shift operation in synchronism with the shift clock signals $\phi$,/$\phi$ supplied from shift clock generator 17.

In the embodiment shown in FIG. 1, in the normal mode, clock generator 14 makes the test enable signal TE attain "L" and the test enable signal /TE attain "H" on the basis of the row address strobe signal /RAS, the column address strobe signal /CAS, and the write enable signal /WE and performs the writing operation and the reading operation in the same way as in the conventional semiconductor memory device described above which is shown in FIG. 12.

On the other hand, in the test mode, clock generator 14 makes the test enable signal TE attain "H" and the test enable signal /TE attain "L" on the basis of the row address strobe signal /RAS, the column address strobe signal /CAS, and write enable signal /WE. During the write operation in the test mode, bit information of the same logic is written into the corresponding memory cell of each of subarrays 5a–5d in the same way as in the conventional semiconductor memory device shown in FIG. 12.

In the embodiment shown in FIG. 1, during the read operation in the test mode, bit information is read from the corresponding memory cell of each of subarrays 5a–5d in the same way as in the conventional semiconductor memory device shown in FIG. 12, and the coincidence/non-coincidence of read bit information and expected value information (information of the same logic as that of bit information written into each memory cell which is selected at that time) supplied as an input thereto from the external input pin $D_{IN}$ is determined by each of exclusive-OR circuits 12a–12d. At this time, a first output N1 from shift register 15 first attains "H", and this causes a transistor 18a to turn on. As a result, the output of exclusive-OR circuit 12a is supplied through transistor 18a to transistor 9. Then, a second output N2 from shift register 15 is made to attain "H" by shift operation, and this causes a transistor 18b to turn on. As a result, the output of exclusive-OR gate 12b is supplied through transistor 18b to transistor 9. Then, in the same manner, the outputs from exclusive-OR circuits 12c, 12d are sequentially supplied to transistor 9. In the test mode, the level of the test enable signal TE is "H", so that transistor 9 is in ON state. Consequently, the outputs of each exclusive-OR gates 12a–12d come to be serially supplied as an output therefrom through transistor 9 to the external output pin $D_{OUT}$.

Figure 2:
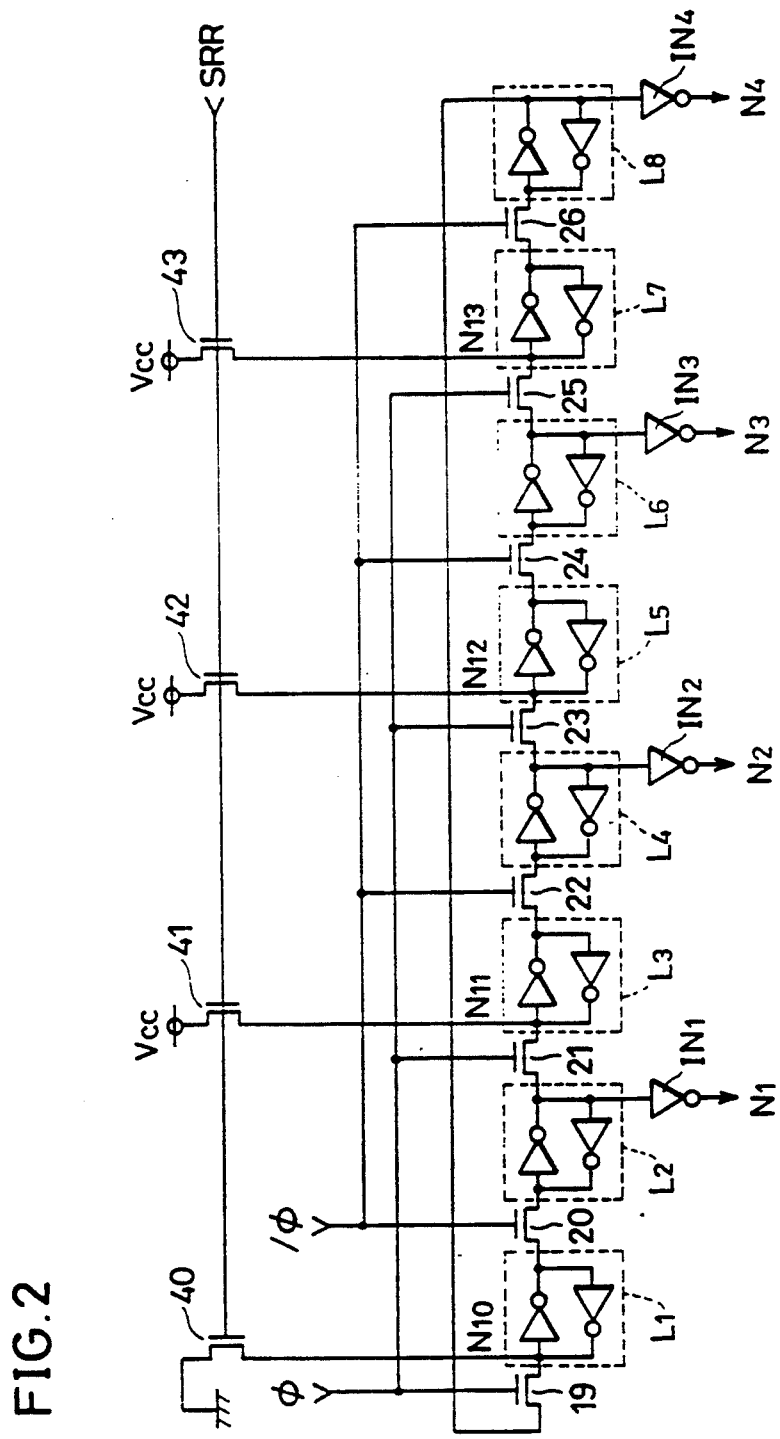
FIG. 2 is a circuit diagram illustrating in more detail the structure of the shift register.

Shift register 15 is constituted, for example, as shown in FIG. 2. As Shown in FIG. 2, shift register 15 includes eight ratio-type latch circuits L1–L8, and the latch circuits L1–L8 are connected in series to one another through transistors 19–26. A shift clock signal $\phi$ is supplied from shift clock generator 17 to each of the gates of transistors 19, 21, 23, and 25 out of the transistors 19–26, and a shift clock signal /$\phi$ is supplied from shift clock generator 17 to each of the gates of the transistors 20, 22, 24, and 26. Moreover, the outputs of the even-numbered latch circuits L2, L4, L6, and L8 are inverted by inverters IN1, IN2, IN3, and IN4 and supplied to the gates of transistors 18a–18d in FIG. 1 as the first to the fourth outputs N1–N4 of shift register 15. One conduction terminal of each of transistors 40–43 which has its gate supplied with a reset signal SRR from shift register reset circuit 16 is connected to the input side of each of the odd-numbered latch circuits L1, L3, L5, and L7, respectively. The other conduction terminal of transistor 40 connected to latch circuit L1 is grounded. The other conduction terminal of each of transistors 41 to 43 connected to the other latch circuits L3, L5, and L7 is connected to the supply voltage Vcc.

Figure 3:
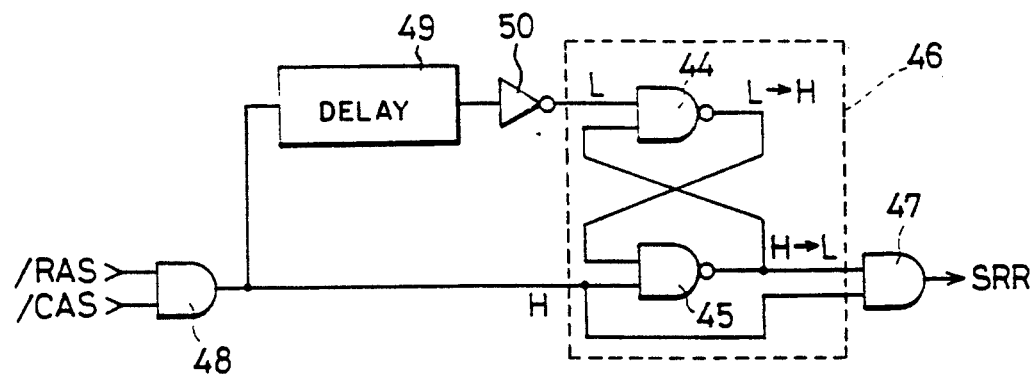
FIG. 3 is a circuit diagram illustrating in more detail the structure of the shift register reset circuit in FIG. 1.

Shift register reset circuit 16 in FIG. 1 is implemented, for example, as shown in FIG. 3. As shown in FIG. 3, shift register reset circuit 16 includes a flip-flop 46 implemented with NAND gates 44, 45 cross connected, AND gates 47, 48, a delay circuit 49, and inverter 50. A row address strobe signal /RAS and a column address strobe signal /CAS are supplied as inputs to AND gate 48. The output of AND gate 48 is on the one hand directly supplied to one input terminal of NAND gate 45, and on the other hand is delayed by delay circuit 49, then inverted by inverter 50, and supplied to one input terminal of NAND gate 44. The output of NAND gate 45 and the output of AND gate 48 are supplied to AND gate 47. The output of AND gate 47 comes to be an output of shift register reset circuit 16.

Consideration is given to the operation in the shift register reset circuit shown in FIG. 3 in the case where the row address strobe signal /RAS and the column address strobe signal /CAS both attain "H" with the output of NAND gate 44 being at "L" and the output of NAND gate 45 being at "H". In this case, the output of AND gate 48 attains "H" and is supplied as an input to NAND gate 45. However, the output of AND gate 48 which is at "H" is supplied through delay circuit 49 to inverter 50, so that the output of inverter 50 remains at "H" at this time. Accordingly, the output of NAND gate 44 remains at "L" and the output of NAND gate 45 remains at "H". Therefore, signals at "H" are supplied from NAND gate 45 and AND gate 48 to AND gate 47, and the output of AND gate 47 is at "H". Subsequently, the output of inverter 50 attains "L". Accordingly, the output of NAND gate 45 attains "L" and, as a result, the output of AND gate 47 attains "L". Consequently, if the row address strobe signal /RAS and the column address strobe signal /CAS attain "H", the output of AND gate 47, i.e. the output of shift register reset circuit 16 are at "H" for only a prescribed time. In other words, if the row address strobe signal /RAS and the column address strobe signal /CAS attain "H", the reset signal SRR is activated for only a prescribed time.

Figure 4:
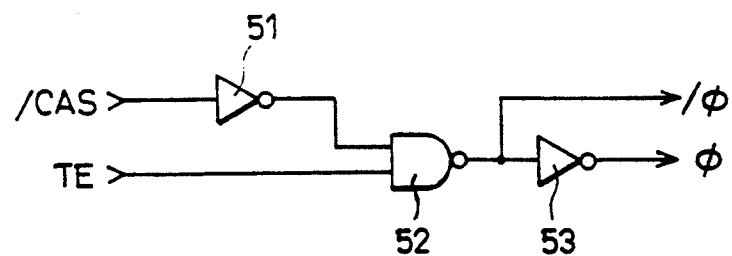
FIG. 4 is a circuit diagram illustrating in more detail the structure of the shift clock generator in FIG. 1.

Shift clock generator 17 in FIG. 1 is implemented, for example, as shown in FIG. 4. Shift clock generator 17 shown in FIG. 4 includes an inverter 51, a NAND gate 52, and an inverter 53. A test enable signal TE is supplied from clock generator 14 in FIG. 1 to one input terminal of NAND gate 52. An inverted signal of a column address strobe signal /CAS is supplied from inverter 51 to the other input terminal of NAND gate 52. The output of NAND gate 52 is supplied as a shift clock signal /φ to shift register 15 shown in FIGS. 1 and 2. On the other hand, the output of NAND gate 52 is inverted in inverter 53 and then supplied as a shift clock signal φ to shift register 15 shown in FIGS. 1 and 2. In the test mode, the test enable signal TE is at "H", so that when the column address strobe signal /CAS is at "H", the output of NAND gate 52, i.e. the shift clock signal /φ attains "H", and the output of inverter 53, i.e. the shift clock signal φ attains "L". Inversely, when the column address strobe signal /CAS is at "L", the shift clock signal /φ attains "L", and the shift clock signal φ attains "H".

Figure 5:
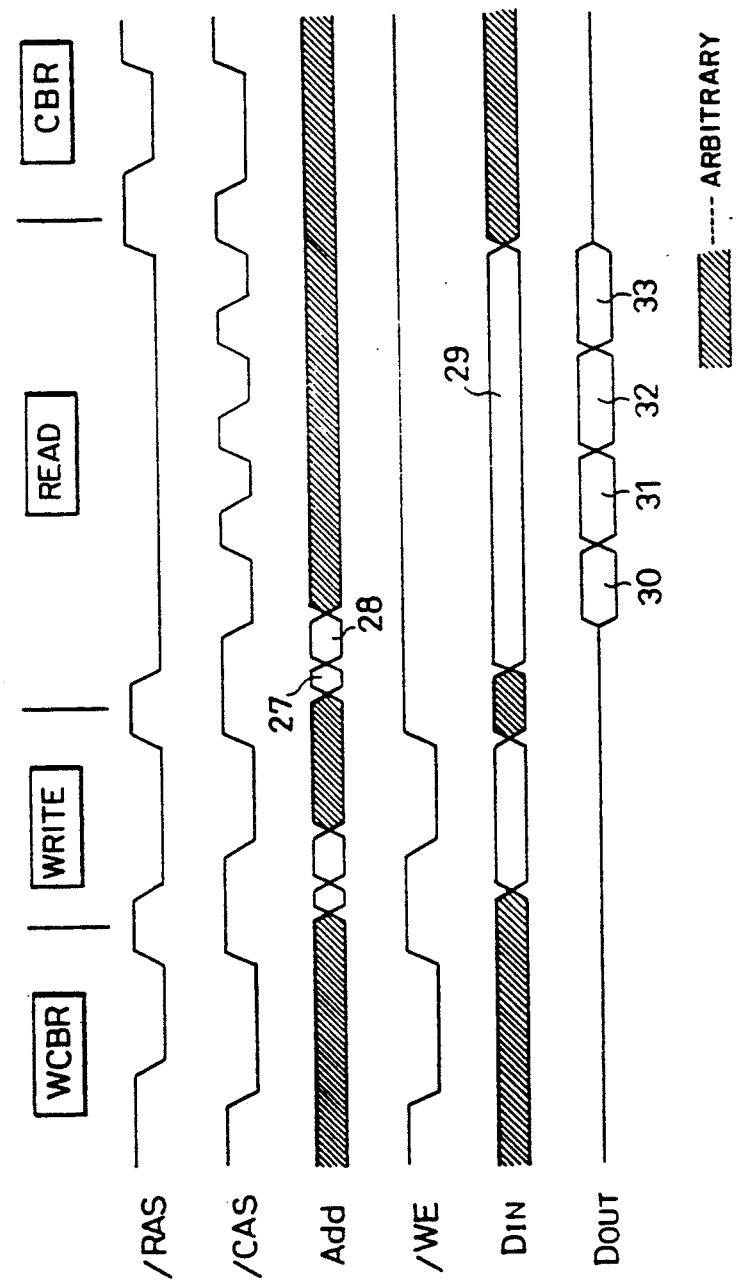
FIG. 5 is a timing chart illustrating the operation in the test mode in the embodiment shown in FIG. 1.
Figure 6:
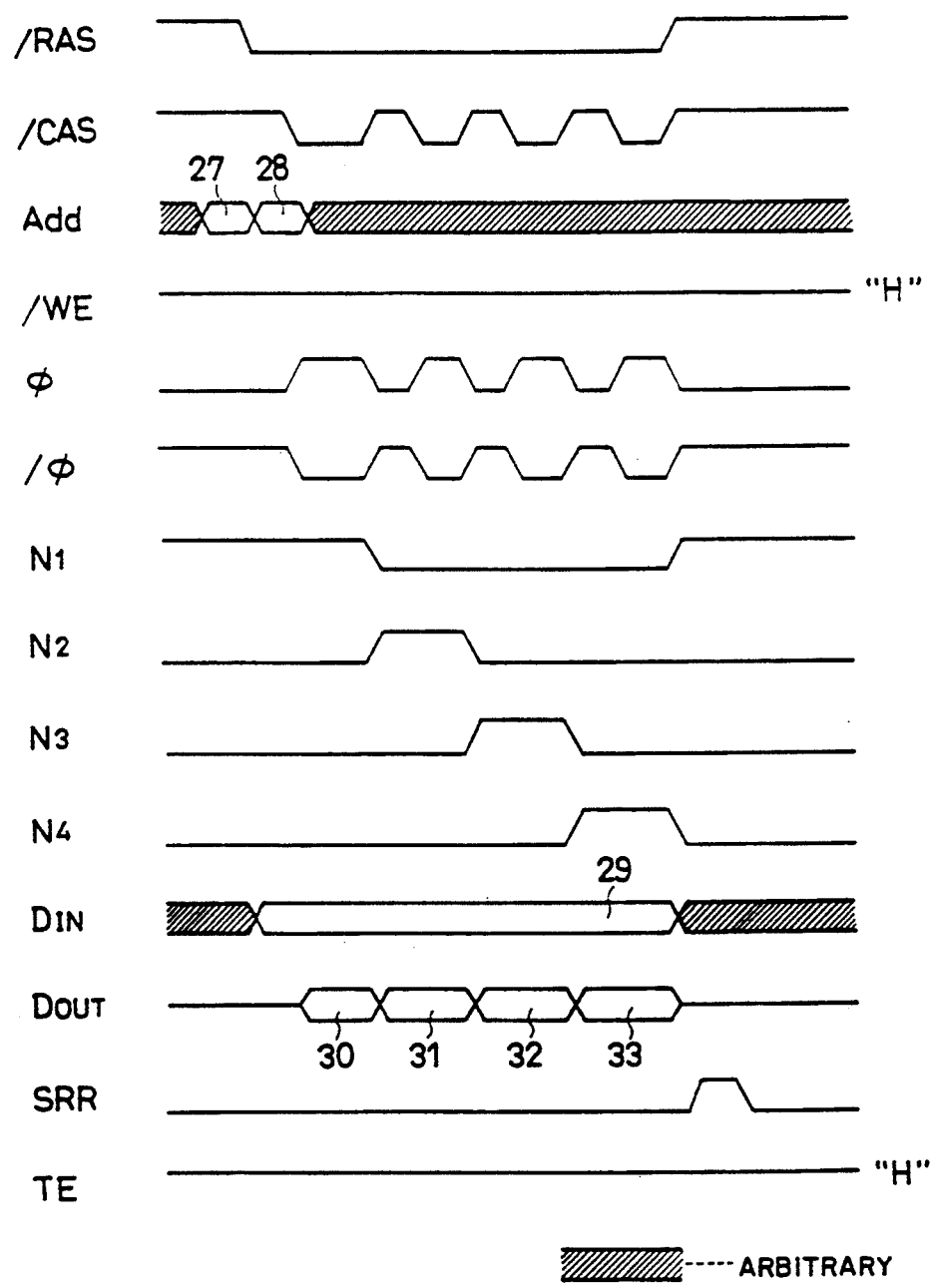
FIG. 6 is a timing chart illustrating in more detail the reading operation in the test mode in the embodiment shown in FIG. 1.

FIG. 5 is a timing chart illustrating the operation in the test mode in the embodiment shown in FIG. 1. FIG. 6 is a timing chart illustrating in more detail the read operation in the test mode (the part marked READ in FIG. 5). Since the feature of the present invention resides in the read operation in the test mode, the operation will be described in detail in the following with reference to the timing charts in FIGS. 5 and 6. Further, as described above, when the column address strobe signal /CAS and the row address strobe signal /RAS both attain "H", shift register reset circuit 16 makes the reset signal SRR be at the active level ("H") for only a prescribed time. Besides, shift clock generator 17 makes the shift clock signal /φ attain "H" and the shift clock signal φ attain "L", and when the column address strobe signal /CAS is at "L", it makes the shift clock signal /φ attain "L" and the shift clock signal φ attain "H".

If the row address strobe signal /RAS and the column address strobe signal /CAS both attain "H", shift register reset circuit 16 makes the reset signal SRR attain an active level ("H"), as described above. The activated reset signal SRR is supplied to each gate of transistors 40–43 shown in FIG. 2. As a result, transistors 40–43 turn on, a signal at "L" is supplied to the input side of latch circuit L1, and a signal at "H" is supplied to the input side of the other latch circuits L3, L5, and L7. At this time, the column address strobe signal /CAS is at "H", so that the shift clock signals φ,/φ generated from shift clock generator 17 are at "L" and "H", respectively. Therefore, transistors 20, 22, 24, and 26 in FIG. 2 are in ON state. Accordingly, latch circuits L2, L4, L6, and L8 fetch data held by latch circuits L1, L3, L5, and L7, respectively. Consequently, the output of latch circuit L2 attains "L", and the outputs of latch circuits L4, L6, and L8 attain "H". Accordingly, output N1 of inverter IN1 attains "H", and outputs N2–N4 of the other inverters IN2–IN4 attain "L". This causes a transistor 18a in FIG. 1 to turn on.

Then, if the level of the row address strobe signal RAS falls to "L", a row address signal 27 (see FIGS. 5, 6) is fetched to decoder 1, and if the level of the column address strobe signal /CAS falls to "L", a column address signal 28 (see FIGS. 5, 6) is fetched to decoder 1.

At this time, in response to the fall of the level of the column address strobe signal /CAS, the shift clock signal φ attains "H", and /φ attains "L". This causes transistors 19, 21, 23, and 25 in FIG. 2 to turn on and transistors 20, 22, 24, and 26 to turn off. As a result, an inverted signal of the output of latch circuit L8, i.e. a signal at "L" is latched in the output terminal of latch circuit L1, an inverted signal of the output of latch circuit L2, i.e. a signal at "H" is latched in the output terminal of latch circuit L3, an inverted signal of the output of latch circuit L4, i.e. a signal at "L" is latched in the output terminal of latch circuit L5, and an inverted signal of the output of latch circuit L6, i.e. a signal at "L" is latched in the output terminal of latch circuit L7, respectively. At this time, transistors 20, 22, 24, and 26 are in OFF state, so that there is no change in outputs N1–N4 of inverters IN1–IN4.

Consequently, the output of exclusive-OR gate 12a, i.e. the test determination result of the selected memory cell in subarray 5a is supplied, through transistor 18a and transistor 9 (which is in ON state because the test enable signal TE is at "H"), to the external output pin $D_{OUT}$. The test determination result supplied as an output therefrom to the external output pin $D_{OUT}$ at this time is indicated by a reference numeral 30 in FIGS. 5, 6.

Then, if the level of the column address strobe signal /CAS rises to "H", the level of the shift clock signal $\phi$ changes to "L", and that of /$\phi$ changes to "H", respectively, and transistors 20, 22, 24, and 26 turn on, and transistors 19, 21, 23, and 25 turn off. Accordingly, an inverted signal of the output of latch circuit L1, i.e. a signal at "H" is latched in the output terminal of latch circuit L2, an inverted signal of the output of latch circuit L3, i.e. a signal at "L" is latched in the output terminal of latch circuit L4, an inverted signal of the output of latch circuit L5, i.e. a signal at "H" is latched in the output terminal of latch circuit L6, and an inverted signal of the output of latch circuit L7, i.e. a signal at "H" is latched in the output terminal of latch circuit L8, respectively. As a result, output N2 of inverter IN2 attains "H", and outputs N1, N3, and N4 of the other inverters IN1, IN3, and IN4 attain "L". This means that the signal at "H" is shifted by one stage. This causes transistors 18a, 18c, and 18d to turn off and transistor 18b to turn on. As a result, the output of exclusive-OR gate 12b is supplied to the external output pin $D_{OUT}$, as illustrated in FIGS. 5, 6 with a reference numeral 31. Then, in the same manner, each time the level of the column address strobe signal /CAS rises to "H", the outputs of exclusive-OR gates 12c, 12d are supplied as an output from the external output pin $D_{OUT}$ (see the signals illustrated in FIGS. 5, 6 with reference numerals 32, 33).

Figure 7:
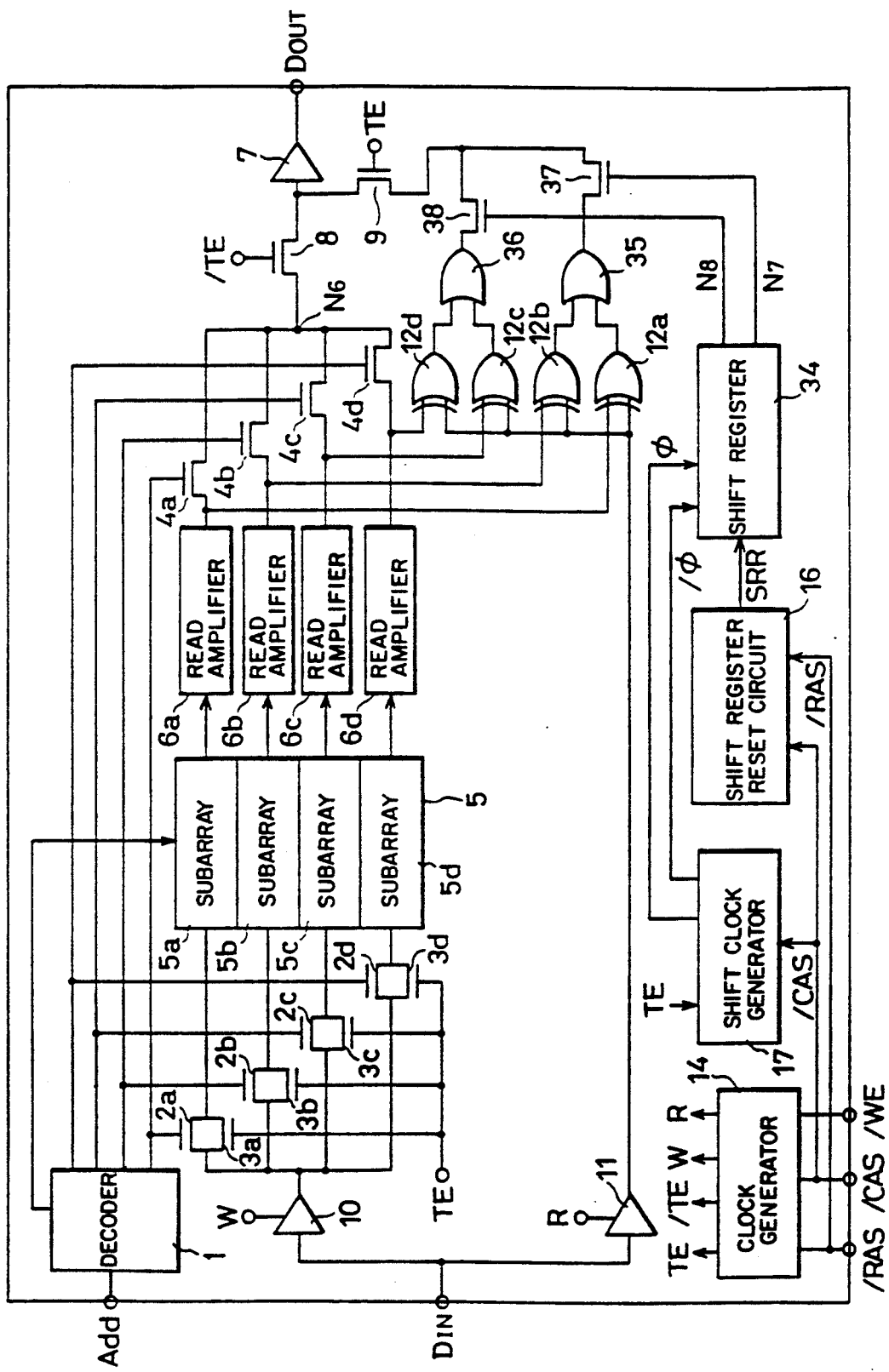
FIG. 7 is a block diagram illustrating the structure of a second embodiment of the present invention.

FIG. 7 is a block diagram illustrating the structure of a second embodiment of the present invention. The second embodiment is different from the first embodiment shown in FIG. 1 in that with the outputs of exclusive-OR gates 12a, 12b supplied as inputs to OR gate 35 and the outputs of exclusive-OR gates 12c, 12d supplied as inputs to OR gate 36, the test determination results of subarrays 5a, 5b are reduced to one, while the test determination results of subarrays 5c, 5d are reduced to one, as shown in FIG. 7. Specifically, if there is abnormality in the memory cell of either of subarrays 5a or 5b, the output of OR gate 35 attains "H", and if there is abnormality in the memory cell of either of subarrays 5c, 5d, the output of OR gate 36 attains "H".

Then, the outputs of OR gates 35, 36 described above are supplied, though transistors 37, 38 controlled by the outputs N7, N8 of shift register 34, transistor 9 controlled by test enable signal TE, and output buffer 7, to the external output pin $D_{OUT}$.

Figure 8:
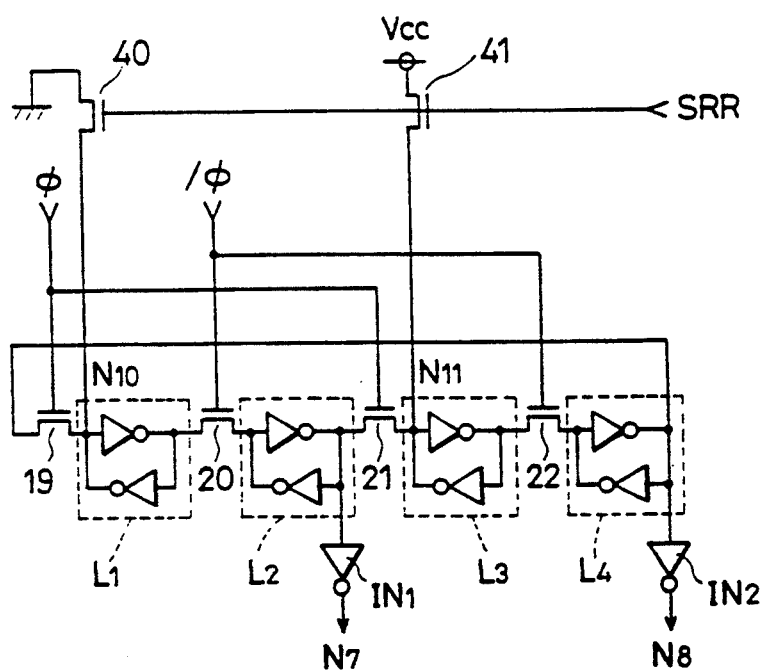
FIG. 8 is a circuit diagram illustrating in more detail the structure of the shift register in FIG. 7.

A shift register implemented with two stages, for example, as shown in FIG. 8 is used as shift register 34 in FIG. 7. The structure of the other parts of the embodiment shown in FIG. 7 is the same as the embodiment shown in FIG. 1, so that the corresponding parts are given the same reference numerals, and description of them is not repeated.

Figure 9:
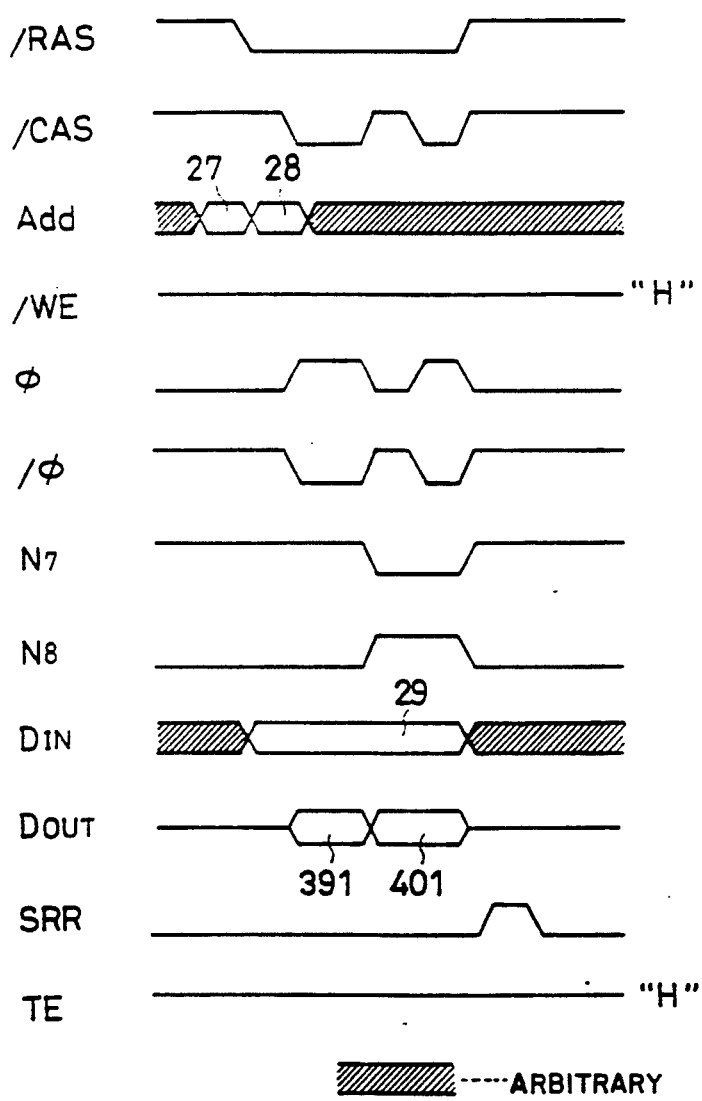
FIG. 9 is a timing chart illustrating in more detail the read operation in the test mode in the embodiment shown in FIG. 7.

FIG. 9 is a timing chart illustrating the read operation in the test mode in the embodiment shown in FIG. 7. As becoming clear from FIG. 9, the operation performed in the embodiment illustrated in FIG. 7 is fundamentally the same as that in the embodiment shown in FIG. 1 except for the respect that the number of stages of the shift register is reduced. In FIG. 9, the signal indicated by the reference numeral 391 is the test determination result output of subarrays 5a, 5b, and the signal indicated by the numeral 401 is the test determination result output of subarrays 5c, 5d.

In the embodiment shown in FIG. 7, although the amount of information of test determination result data supplied to the outside becomes less than that in the embodiment shown in FIG. 1, the time required for reading in the test mode becomes shorter than that in the embodiment shown in FIG. 1 in proportion as the amount of information of the test determination result data is decreased.

Figure 10:
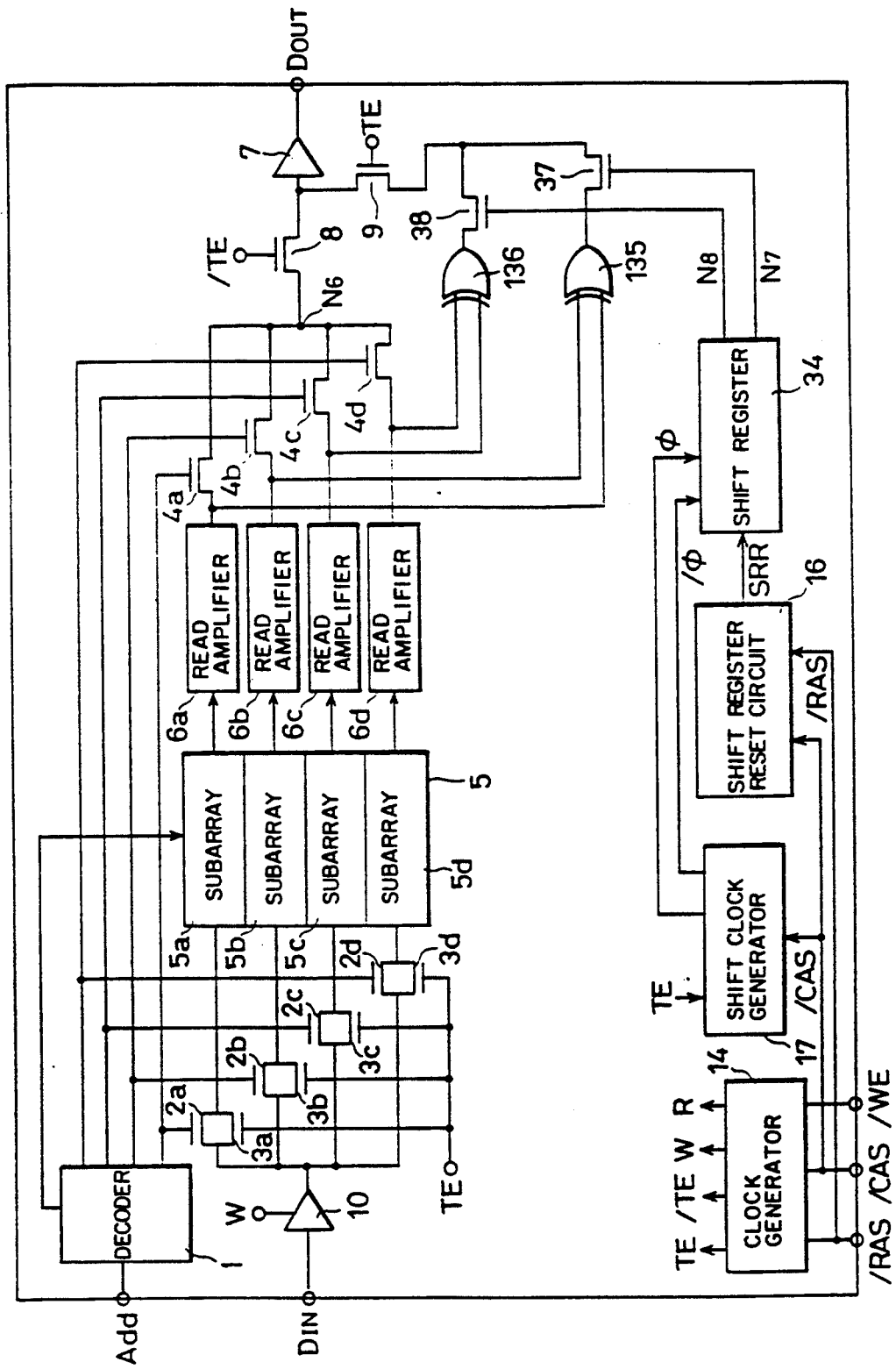
FIG. 10 is a block diagram illustrating the structure of a third embodiment of the present invention.

FIG. 10 is a block diagram illustrating the structure of a third embodiment of the present invention. The embodiment shown in FIG. 10 is different from the embodiment shown in FIG. 1 in the following respects. In the embodiment shown in FIG. 10, the outputs of read amplifiers 6a, 6b, i.e. bit information read from subarrays 5a, 5b, is supplied as inputs to exclusive-OR gate 135, and the outputs of read amplifiers 6c, 6d, i.e. bit information read from subarrays 5c, 5d, are supplied as inputs to exclusive-OR gate 136. Specifically, in the embodiment shown in FIG. 10, a test is performed by determining coincidence/non-coincidence of the logics of bit information simultaneously read by exclusive-OR gates 135, 136 and expected value data is not used. The outputs of exclusive-OR gates 135, 136 are supplied, through transistors 37, 38 controlled by the outputs N7, N8 of shift register 34, transistor 9 controlled by the test enable signal TE, and output buffer 7, to the external output pin $D_{OUT}$. The structure of shift register 34 is the same as that of the shift register 34 in FIG. 7 and, for example, implemented as shown in FIG. 8. The structure of the other parts in the embodiment shown in FIG. 10 is the same as in the embodiment shown in FIG. 1, so that the corresponding parts are given the same reference numerals and description of them is not repeated.

Figure 11:
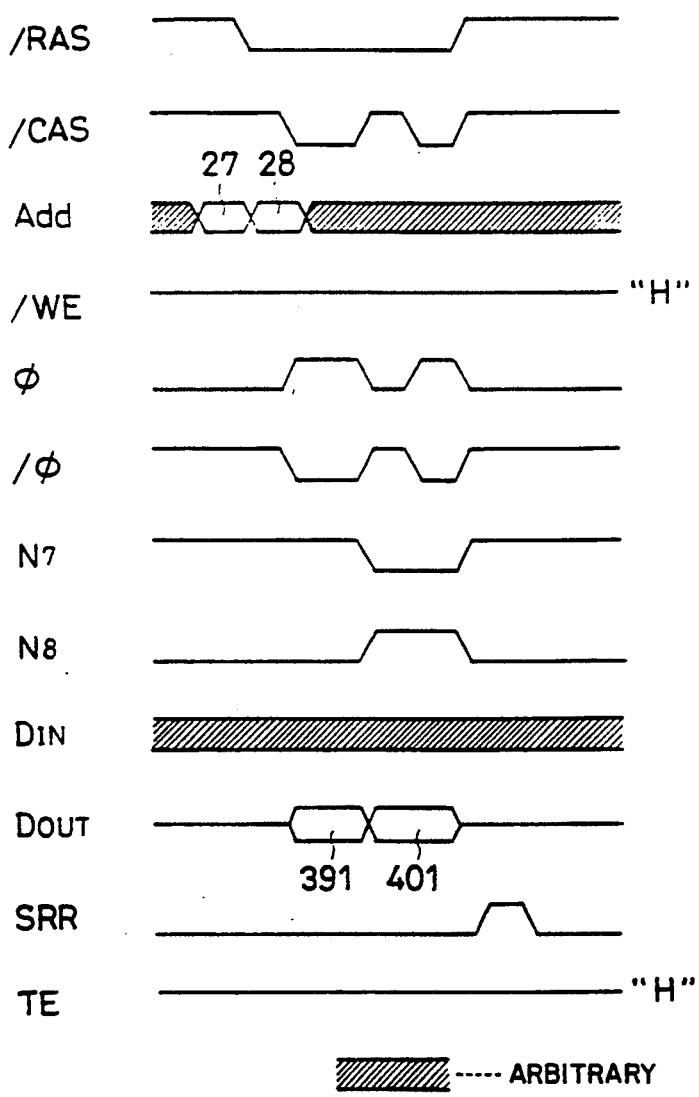
FIG. 11 is a timing chart illustrating in more detail the read operation in the test mode in the embodiment shown in FIG. 10.

FIG. 11 is a timing chart illustrating the read operation in the test mode in the embodiment shown in FIG. 10. As becoming clear from FIG. 11, the read operation in the test mode in the embodiment shown in FIG. 10 is exactly the same as that in the embodiment shown in FIG. 7 except for the respect that expected value data is not supplied as an input from the external input pin $D_{IN}$.

In the embodiment shown in FIG. 10, although the amount of information of the test determination result data fetched to the outside is less than that in the embodiment shown in FIG. 1, the time required for reading in the test mode becomes shorter than that in the embodiment shown in FIG. 1 in proportion as the amount of information of the test determination result data is reduced, as in the embodiment shown in FIG. 7. Besides, in the embodiment shown in FIG. 10, since it is not necessary to externally supply expected value data as an input in the test mode, control in the test mode is simplified.

In the three embodiments described above, while the memory cell array is partitioned into four subarrays, the number of partitions is not limited to four and can be optionally changed according to situations. Besides, while the present invention is applied to a test for a DRAM in each embodiment described above, application of the invention is not limited to this, and it is possible to apply the invention to a test for a semiconductor memory device other than a DRAM.

As described above, according to the present invention, since a prescribed logical operation is performed on stored information read from the selected memory cell of each of the subarrays, while the result of the logical operation is serially supplied to a single output pin, it is possible to obtain a more detailed test determination result data than that of the conventional semiconductor memory device shown in FIG. 12.

Furthermore, in the present invention, when the operation result of the logical operation means, i.e. the test determination result data is supplied as an output, it is made to be directly supplied to a single output pin by sequentially and selectively on-off controlling each switching means, and, therefore, it is possible to supply the test determination result data as an output at a higher speed, and both the structure and the control are simple in comparison with the conventional test circuit in which the test determination result data is once latched in the shift register circuit and then shifted and obtained therefrom as a shifted output.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit for testing a semiconductor memory device provided with a memory cell array partitioned into a plurality of subarrays:
   writing means for writing bit information of the same logic into a corresponding memory cell in each of said subarrays;
   reading means for reading stored information from the memory cell in each of said subarrays into which writing has been performed by said writing means;
   logical operation means for performing a test by performing a prescribed logical operation on stored information in the memory cell in each of said subarrays read by said reading means to supply the test result as a plurality of bits of parallel data as an output;
   a single output pin for supplying the test result output of said logical operation means to the outside;
   a plurality of switching means interposed between respective bits of the output data of said logical operation means and said single output pin;
   switch control means for sequentially and selectively turning on each of said switching means to serially apply the parallel data output of said logical operation means to said first output pin.

2. A test circuit of a semiconductor memory device according to claim 1, wherein said logical operation means supplies said test result output for each of said subarrays.

3. A test circuit of a semiconductor memory device according to claim 2, wherein said logical operation means includes a plurality of logic gates for determining coincidence/non-coincidence of stored information read from the memory cell in each of said subarrays and expected value information.

4. A test circuit of a semiconductor memory device according to claim 1, wherein said logical operation means reduces the number of said test result outputs to a number less than the number of said subarrays to supply them as outputs.

5. A test circuit of a semiconductor memory device according to claim 4, wherein said logical operation means includes:
   a plurality of first logic gates for determining coincidence/non-coincidence of stored information read from the memory cell in each of said subarrays and expected value information; and
   a plurality of second logic gates for performing a logical operation on each output of said plurality of first logic gates for each prescribed group to determine if the logics of respective outputs in respective groups correspond with each other or not.

6. A test circuit of a semiconductor memory device according to claim 4, wherein said logical operation means includes a plurality of logic gates for performing a logical operation on stored information read from the memory cell in each of said subarrays for each prescribed group to determine if the logics of said read stored information in respective groups correspond with each other or not.

* * * * *